United States Patent
Kim et al.

(10) Patent No.: US 8,124,978 B2
(45) Date of Patent: Feb. 28, 2012

(54) CAPACITOR AND METHOD OF MANUFACTURING THE SAME

(75) Inventors: Hyun-Young Kim, Seoul (KR);
Rak-Hwan Kim, Suwon-si (KR);
Young-Joo Cho, Suwon-si (KR);
Won-sik Shin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/659,553

(22) Filed: Mar. 12, 2010

(65) Prior Publication Data
US 2010/0188795 A1    Jul. 29, 2010

Related U.S. Application Data

(62) Division of application No. 11/254,851, filed on Oct. 21, 2005, now Pat. No. 7,709,342.

(30) Foreign Application Priority Data

Oct. 26, 2004  (KR) .................................. 2004-85672

(51) Int. Cl.
*H01L 29/12* (2006.01)
*H01L 29/786* (2006.01)
*H01L 27/108* (2006.01)
*H01L 29/94* (2006.01)

(52) U.S. Cl. .......... 257/71; 257/303; 257/306; 257/308; 257/E29.342

(58) Field of Classification Search .................. 257/303, 257/308, 206, 71, E29.342
See application file for complete search history.

(56) References Cited

U.S. PATENT DOCUMENTS

| | | | |
|---|---|---|---|
| 5,879,988 A | 3/1999 | Chen et al. | |
| 5,893,734 A | 4/1999 | Jeng et al. | |
| 6,500,763 B2 | 12/2002 | Kim et al. | |
| 6,599,799 B2 * | 7/2003 | Tang et al. | 438/253 |
| 6,656,784 B2 | 12/2003 | Pakr | |
| 6,780,758 B1 | 8/2004 | Derderian et al. | |
| 7,524,724 B2 | 4/2009 | Kim et al. | |
| 2002/0084471 A1 * | 7/2002 | Won et al. | 257/200 |
| 2003/0122174 A1 | 7/2003 | Fukuzumi | |
| 2003/0153146 A1 | 8/2003 | Won et al. | |

FOREIGN PATENT DOCUMENTS

| | | |
|---|---|---|
| JP | 2002-026296 | 1/2002 |
| KR | 10-2000-0082066 | 12/2000 |
| KR | 2001-0046630 | 6/2001 |

OTHER PUBLICATIONS

Korean Office Action dated Jan. 11, 2006, in corresponding Korean Application No. 10-2004-0085672.

* cited by examiner

*Primary Examiner* — Alexander Ghyka
*Assistant Examiner* — Seahvosh Nikmanesh
(74) *Attorney, Agent, or Firm* — Harness, Dickey & Pierce, P.L.C.

(57) ABSTRACT

A capacitor and method of manufacturing the same include an insulating interlayer, a lower electrode, a protection structure, a dielectric layer and an upper electrode. The insulating interlayer may include a conductive pattern formed on a substrate. The lower electrode may be electrically connected to the conductive pattern. The protection structure may be formed on an outer sidewall of the cylindrical lower electrode and on the insulating interlayer.

18 Claims, 14 Drawing Sheets

CAPACITOR AND METHOD OF MANUFACTURING THE SAME

PRIORITY STATEMENT

This application is a divisional application of U.S. Ser. No. 11/254,851, filed on Oct. 21, 2005 now U.S. Pat. No. 7,709,342, which claims priority under U.S.C. §119 to Korean Patent Application No. 2004-85672, filed on Oct. 26, 2004, the entire contents of which are incorporated herein by reference.

BACKGROUND OF THE INVENTION

1. Field of the Invention

Example embodiments of the present invention relate to a capacitor and a method of manufacturing the capacitor. More particularly, example embodiments of the present invention relate to a capacitor having a protection structure and a method of manufacturing the capacitor.

2. Description of the Related Art

Recently, semiconductor devices have higher response speed, larger storage capacity, and/or lower power consumption and information processing devices, which incorporate the semiconductor devices, have been widely used. The semiconductor devices may be generally divided into volatile semiconductor memory devices and non-volatile semiconductor memory devices. Volatile semiconductor memory devices may include dynamic random access memory (DRAM) devices and static random access memory (SRAM) devices. In general, a volatile semiconductor memory device, for example, a DRAM device, has a capacitor and a switching element, for example, a transistor.

A polysilicon-insulator-polysilicon (PIP) capacitor has been employed in semiconductor memory devices. A PIP capacitor may be easily formed because polysilicon is relatively stable at a high temperature. In addition, manufacturing technology for capacitors, for example, a chemical vapor deposition (CVD) process, has become highly developed. However, electrical characteristics of the PIP capacitor may vary in accordance with an applied voltage. Particularly, because a lower electrode and an upper electrode of the PIP capacitor are made of polysilicon, depletion layers may be formed between the upper electrode and an insulation layer and between the insulation layer and the lower electrode. When the depletion layers are formed in the PIP capacitor, a thickness of a dielectric layer may relatively increase, which may cause the PIP capacitor to have a deteriorated capacitance. In particular, if the PIP capacitor is used for highly integrated semiconductor device having a design rule of below about 90 nm, the semiconductor device may not have the desired capacitance.

Considering the above-disclosed disadvantages of a PIP capacitor, a metal-insulator-metal (MIM) capacitor has been developed. In a method of manufacturing a conventional MIM capacitor, an insulating interlayer may be formed on a substrate, and a contact pad may be formed through the insulating interlayer. The contact pad may be formed using doped polysilicon, because metal may melt or diffuse into the substrate at relatively high temperatures in proceeding process steps. A metal cylindrical lower electrode may be formed on the contact pad. Here, galvanic coupling may be generated between the lower electrode and the polysilicon contact pad. Galvanic coupling may be generated between two different conductive material layers or patterns. When the galvanic coupling is formed between two different conductive layers or patterns, one of the conductive layers or patterns may erode. If galvanic coupling is generated between the lower electrode and the polysilicon contact pad, the polysilicon in the contact pad may be rapidly eroded by chemicals used in proceeding etching processes. As a result, a void may be formed between the contact pad and the lower electrode because the contact pad may be rapidly etched in an etching process.

FIG. 1 is a cross-sectional view illustrating a void formed in a contact pad electrically connected to a prior art capacitor. Referring to FIG. 1, the prior art capacitor may include a lower electrode 18 positioned on a contact pad 14, a dielectric layer 20 formed on the lower electrode 18, and an upper electrode 22 formed on the dielectric layer 20. The contact pad 14 may make contact with a contact region 12 formed in a substrate 10.

When a void 16 is formed in the contact pad 14, the resistance between the contact pad 14 and the lower electrode 18 may increase such that an electrical failure may occur in the capacitor. Additionally, the contact pad 14 may not be capable of supporting the lower electrode 18, if the size of the void 16 is relatively large. Hence, the capacitor may fall over toward the substrate 10.

To overcome the above-described problems, a method of manufacturing a capacitor by minimizing permeation of chemicals has been suggested. In this method, the permeation of a wet etching solution may be prevented by a plasma nitrification treatment around a sidewall of a concave groove formed on a mold layer. However, even though nitrogen atoms are introduced onto the surface of the concave groove through the plasma nitrification treatment, the permeation of the wet etching solution may not be completely blocked, and the wet etching solution may still permeate into a contact pad and a lower electrode. Additionally, if only the sidewall of the concave groove is nitrified, the wet etching solution may still permeate into the contact pad positioned under the lower electrode.

According to another prior art method, an oxide mold layer may be formed on a first barrier layer and a second barrier layer, and a contact hole may be formed through the oxide mold layer. After a third barrier layer is formed on a sidewall of the contact hole, a ruthenium lower electrode may be formed in the contact hole. Because the barrier layers may be of conductive titanium nitride, the barrier layers should be removed by additional processes. However, portions of the barrier layers may remain, which may cause electrical failure between adjacent capacitors. Further, etching gases used to remove the titanium nitride layer may attack the contact pad causing damage to the contact pad.

SUMMARY OF THE INVENTION

In an embodiment of the present invention, a capacitor includes an insulating interlayer including a conductive pattern formed on a substrate, a lower electrode electrically connected to the conductive pattern, a protection structure formed on an outer sidewall of the lower electrode and on the insulating interlayer, a dielectric layer formed on the lower electrode and the protection structure, and an upper electrode formed on the dielectric layer.

In an embodiment of the present invention, a method of manufacturing a capacitor includes forming an insulating interlayer having a conductive pattern on a substrate, forming a first protection layer on the insulating interlayer, forming a mold layer on the first protection layer, the mold layer having an opening that exposes the conductive pattern, and forming a second protection layer on a sidewall of the opening to form a protection structure including the first protection layer with the second protection layer. The method further includes forming a lower electrode on the conductive pattern, wherein the second protection layer encloses an outer sidewall of the lower electrode, forming a dielectric layer on the lower electrode and the protection structure, and forming an upper electrode on the dielectric layer.

In another embodiment of the present invention, a method of manufacturing a capacitor includes forming an insulating interlayer having a conductive pattern on a substrate, forming a first protection layer on the insulating interlayer, forming a first mold layer on the first protection layer, forming a supporting layer on the first mold layer, forming a second mold layer on the supporting layer, forming an opening exposing the conductive pattern by partially etching the second mold layer, the supporting layer and the first mold layer, and forming a second protection layer on a sidewall of the opening to form a protection structure including the first protection layer and the second protection layer. The method further includes forming a cylindrical lower electrode on the conductive pattern and the second protection layer, wherein the second protection layer encloses an outer sidewall of the cylindrical lower electrode, forming a supporting member enclosing the second protection layer around an upper portion of the cylindrical lower electrode, wherein the supporting member is connected to an adjacent supporting member of an adjacent capacitor, forming a dielectric layer on the cylindrical lower electrode and the protection structure, and forming an upper electrode on the dielectric layer.

BRIEF DESCRIPTION OF THE DRAWINGS

The present invention will become more apparent with the description of example embodiments thereof with reference to the accompanying drawings, in which.

DESCRIPTION OF EXAMPLE EMBODIMENTS

Figure 1:
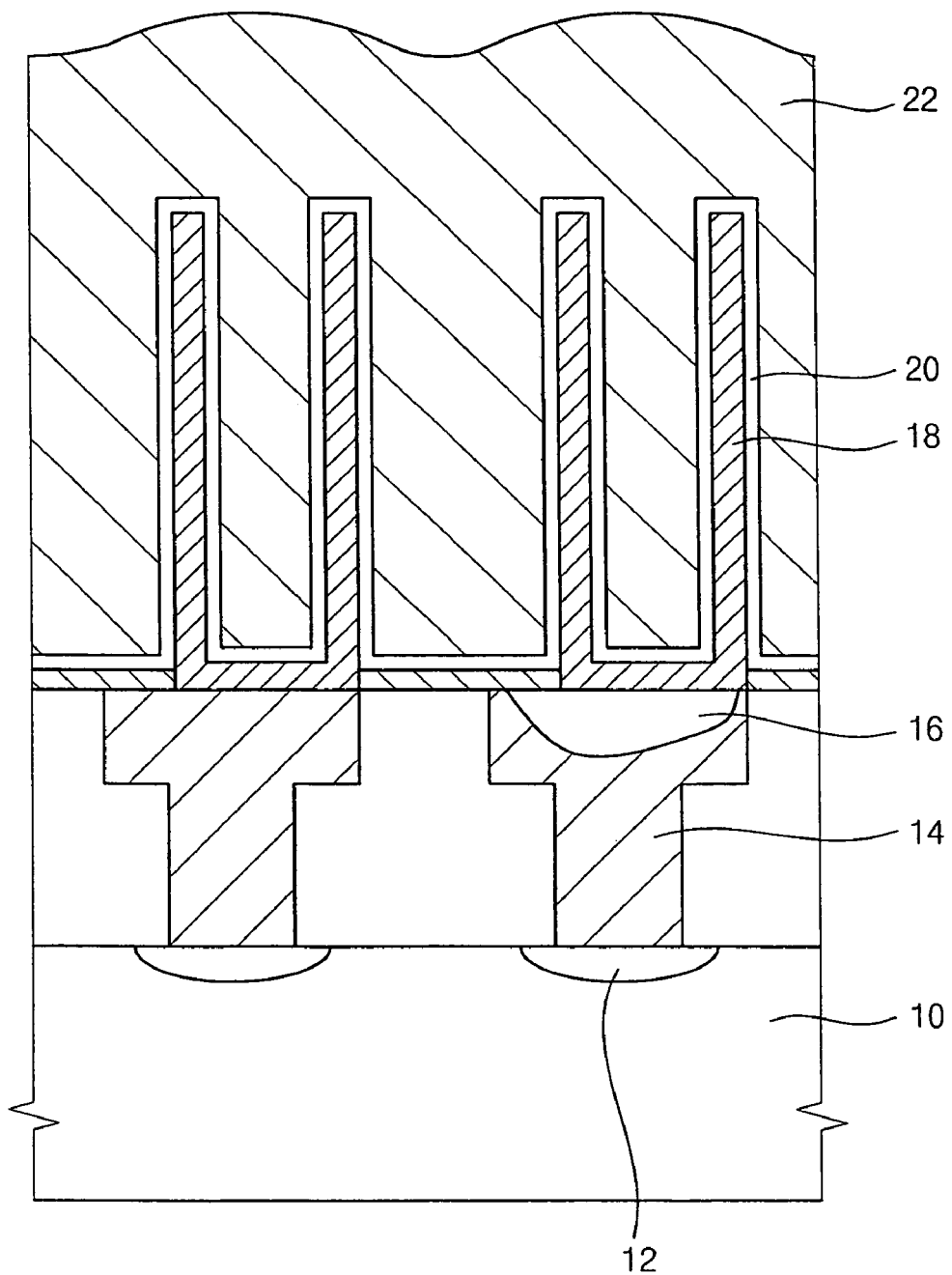
FIG. 1 is a cross-sectional view illustrating a void formed in a contact pad electrically connected to a capacitor of the prior art.

The present invention is described more fully hereinafter with reference to the accompanying drawings, in which example embodiments of the invention are shown. The present invention may, however, be embodied in many different forms and should not be construed as limited to example embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, for example, "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, for example, those defined in commonly used dictionaries, should be interpreted as having a meaning that is consistent with their meaning in the context of the relevant art and will not be interpreted in an idealized or overly formal sense unless expressly so defined herein.

Figure 2:
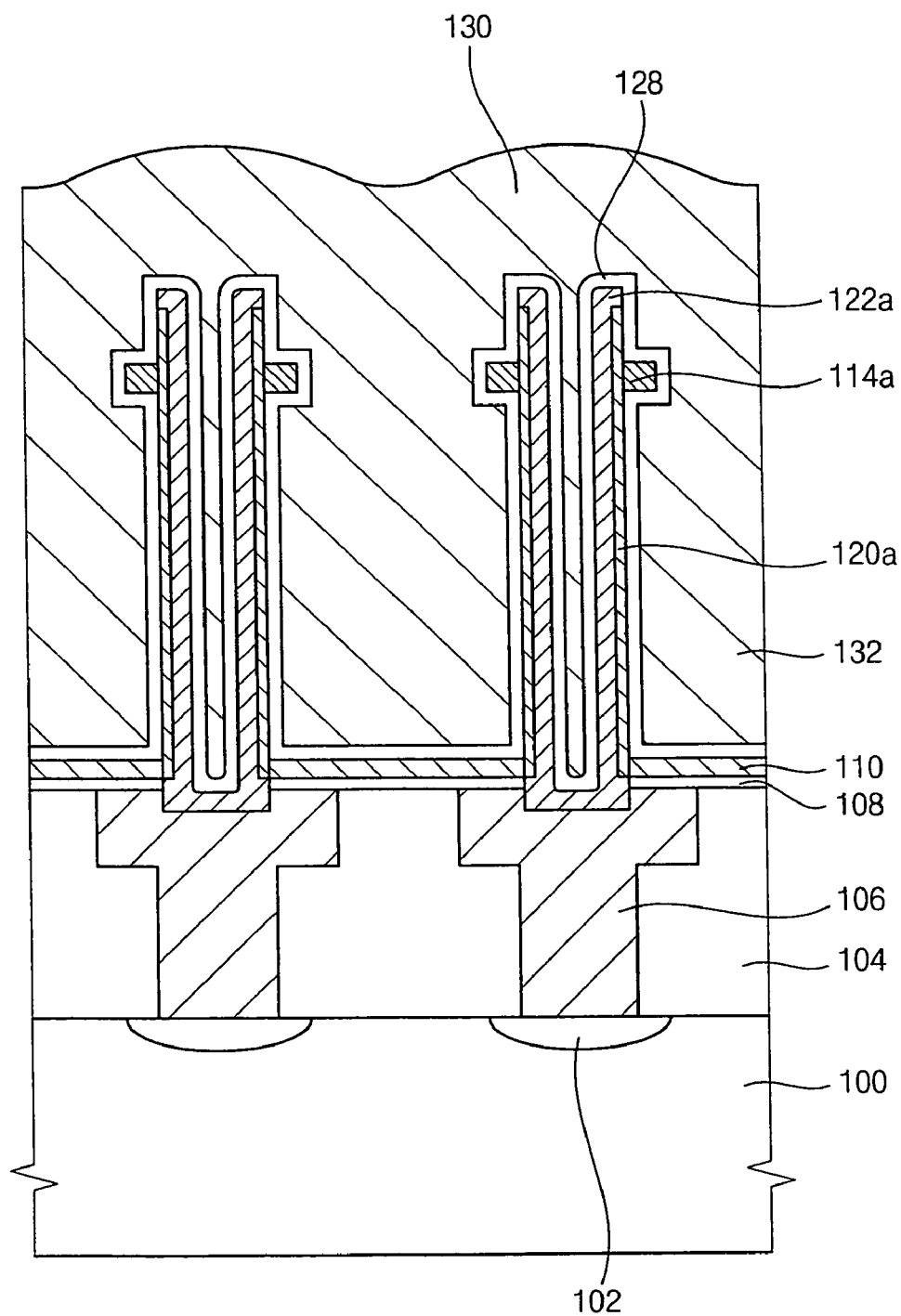
FIG. 2 is a cross-sectional view illustrating a capacitor in accordance with an example embodiment of the present invention.

FIG. 2 is a cross-sectional view illustrating a capacitor in accordance with an example embodiment of the present invention.

Referring to FIG. 2, the capacitor may include a lower electrode 122a, a dielectric layer 128, an upper electrode 130, and a protection structure having a first protection layer 110 and a second protection layer 120a.

The substrate 100 may include an active region defined by an isolation layer (not shown). A transistor (not shown) may be formed on the substrate 100. The transistor may include a gate structure and source/drain regions. One of the source/drain regions may be electrically connected to the capacitor. A contact region 102 may be formed in the active region of the substrate 100. For example, the contact region 102 may be the source region of the transistor.

An insulating interlayer 104 may be formed on the substrate 100 to cover the contact region 102 and the transistors. The insulating interlayer 104 may be of an oxide. For example, the insulating interlayer 104 may be boro-phosphor silicate glass (BPSG), phosphor silicate glass (PSG), undoped silicate glass (USG), spin on glass (SOG), tetraethylorthosilicate (TEOS), and/or high density plasma-chemical vapor deposition (HDP-CVD) oxide.

A pad 106 may be formed through the insulating interlayer 104. The pad 106 may make electrical contact with the contact region 102. The pad 106 may be of a conductive material for example a metal material having a relatively high melting point or polysilicon doped with impurities. For example, the pad 106 may be formed of tungsten (W), titanium (Ti), aluminum (Al), tantalum (Ta), and/or copper (Cu). An upper portion of the pad 106 may be substantially larger than a lower portion thereof. For example, the pad 106 may have a cross section in a "T" shape.

An etch stop layer 108 may be formed on the insulating interlayer 104 and the pad 106. The etch stop layer 108 may be of a material that has an etching selectivity relative to the oxide. For example, the etch stop layer 108 may be of nitride for example silicon nitride. The etch stop layer 108 may partially cover an upper face of the pad 106.

The lower electrode 122a may be located on the pad 106 that makes contact with the contact region 102. Namely, the lower electrode 122a may be electrically connected to the contact region 102 through the pad 106. In addition, the lower electrode 122a may have a cylindrical shape. The lower electrode 122a may be formed of a metal material with a sufficient step coverage to form a cylindrical shape. For example, the lower electrode 122a may be formed of a metal material for example titanium, tantalum, tungsten, and/or aluminum. Alternatively, the lower electrode 122a may be a metal/metal compound structure for example titanium/titanium nitride. The pad 106 may have a recess at an upper central portion thereof. The lower electrode 122a may be formed in the recess of the pad 106. That is, a bottom portion of the lower electrode 122a may be buried at the upper central portion of the pad 106. The etch stop layer 108 may not be formed in the recess. The etch stop layer 108 may be formed on the pad 106, but not the upper central portion of the pad 106.

The first protection layer 110 of the protection structure may be formed on the etch stop layer 108. The first protection layer 110 may be formed of an insulation material that has a higher etching selectivity relative to the oxide, so that the first protection layer 110 may be protected during an etching process of the oxide. The first protection layer 110 may be of a metal oxide for example, hafnium oxide, a nitride for example silicon nitride, an oxynitride, and/or an anti-reflective coating material. In an example embodiment of the present invention, a surface of the first protection layer 110 may be treated with plasma. In another example embodiment of the present invention, the surface of the first protection layer 110 may be thermally treated.

A second protection layer 120a may be formed on an outer sidewall of the lower electrode 122a. The second protection layer 120a may enclose the lower electrode 122a. For example, in an example embodiment of the present invention, the second protection layer 120a may be buried in the outer sidewall of the lower electrode 122a by a dielectric layer 128. The second protection layer 120a may also be formed of an insulation material that has an etching selectivity relative to the oxide, so that the second protection layer 120a may be protected during the etching process of the oxide. The second protection layer 120a may be of a metal oxide for example hafnium oxide, a nitride for example, silicon nitride, an oxynitride, and/or an anti-reflective coating material. A surface of the second protection layer 120a may be treated with plasma. Alternatively, the surface of the second protection layer 120a may be thermally treated.

In an example embodiment of the present invention, the first protection layer 110 may be formed of an insulation material substantially identical to that of the second protection layer 120a. Alternatively, the second protection layer 120a may be formed of an insulation material different from that of the first protection layer 110.

In an example embodiment of the present invention, the first protection layer 110 may be connected to the second protection layer 120a. Alternatively, the first and the second protection layers 110 and 120a may be integrally formed. The protection structure having the first and the second protection layers 110 and 120a may be positioned on the etch stop layer 108 to enclose the lower electrode 122a. The protection structure prevents etching chemicals from permeating into the lower electrode 122a, the pad 106, and/or other underlying layers.

The capacitor may further include a supporting member 114a enclosing the second protection layer 120a. The supporting member 114a may be positioned around an upper portion of the lower electrode 122a. The supporting member 114a may connect one capacitor to an adjacent capacitor along a diagonal direction relative to contact regions 102 to form a mesh structure. The supporting member 114a may be formed of an insulation material. The supporting member 114a may be formed of a nitride for example silicon nitride.

A dielectric layer 128 may be formed on the lower electrode 122a, the protection structure and the supporting member 114a. The dielectric layer 128 may be formed of a metal oxide that has a high dielectric constant. For example, the dielectric layer 128 may be formed of hafnium oxide, titanium oxide, or aluminum oxide.

An upper electrode 130 may be positioned on the dielectric layer 128. The upper electrode 130 may cover the lower electrode 122a. The upper electrode 130 may be formed of a metal material or polysilicon doped with impurities.

In the above-described construction of an example embodiment of the capacitor of the present invention, the protection structure may protect the lower electrode 122a, the pad 106 and/or other underlying layers from etching chemicals. Therefore, the lower electrode 122a, the pad 106 and the other underlying layers may be protected. Additionally, example embodiments of the present invention may have improved electrical characteristics and/or an enhanced structural stability.

FIGS. 3 to 9 are cross-sectional views illustrating a method of manufacturing a capacitor in accordance with an example embodiment of the present invention.

Figure 3:
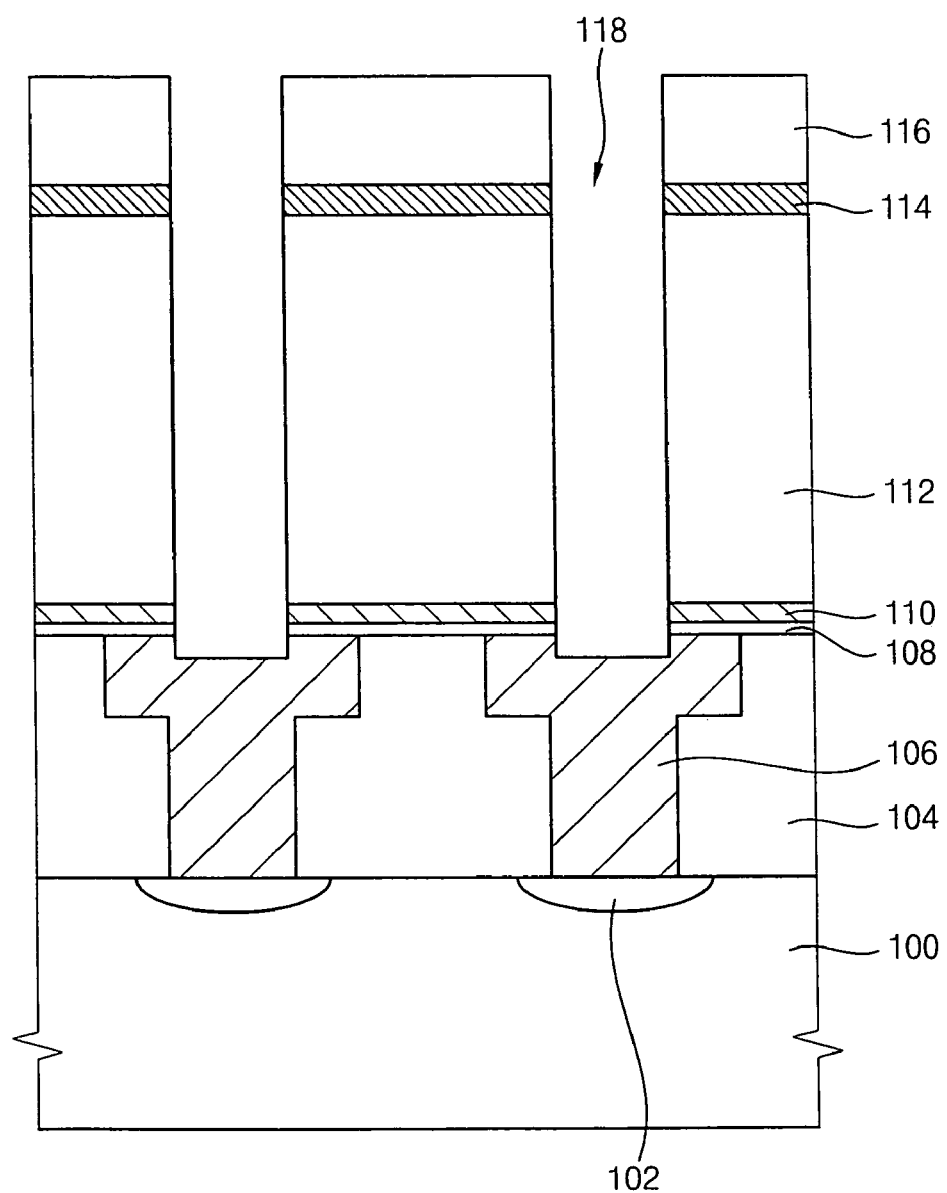
FIGS. 3 to 9 are cross-sectional views illustrating a method of manufacturing a capacitor in accordance with an example embodiment of the present invention.

Referring to FIG. 3, an isolation layer (not shown) may be formed on a semiconductor substrate 100 by an isolation process for example, a trench isolation process. When the isolation layer is formed, an active region of the substrate 100 may be defined.

A transistor (not shown) may be formed on the active region of the substrate 100. The transistor may include a gate structure and source/drain regions. The gate structure may include a gate insulation layer, a gate electrode, a gate mask and/or a gate spacer. One of the source/drain regions may correspond to a contact region 102.

An insulating interlayer 104 may be formed on the substrate 100 to cover the transistor. In an example embodiment of the present invention, wiring for example, a bit line may be formed on the insulating interlayer 104, and another insulation interlayer may be formed on the insulating interlayer 104 to cover the wiring.

A contact hole (not shown) may be formed through the insulating interlayer 104 by partially etching the insulating interlayer 104 with a photolithography process. The contact hole may expose the contact region 102. In an example embodiment of the present invention, an upper portion of the contact hole may be substantially wider than a lower portion of the contact hole.

After a conductive layer is formed in the insulating interlayer 104 to fill the contact hole, the conductive layer may be planarized until the insulating interlayer 104 is exposed to thereby form a pad 106 in the contact hole. The pad 106 may be formed of polysilicon doped with impurities. Alternatively, the pad 106 may be formed of a metal material having a high melting point for example tungsten or titanium.

If the upper portion of the contact hole is wider than the lower portion thereof, the pad 106 may also have an upper portion substantially wider than a lower portion. If the pad 106 has a wide upper portion, it may be easier to align a lower electrode 122a (see FIG. 7) with the pad 106.

An etch stop layer 108 may be formed on the insulating interlayer 104 and the pad 106. The etch stop layer 108 may be formed of a material that has an etching selectivity relative to the insulating interlayer 104, a first mold layer 112 and a second mold layer 116. For example, the etch stop layer 108 may be of silicon nitride having an etching selectivity with respect to the oxide.

A first protection layer 110 may be formed on the etch stop layer 108. The first protection layer 110 may reduce or prevent etching chemicals from permeating into the pad 106 and the insulating interlayer 104. The first protection layer 110 may be formed of a material having an etching selectivity relative to the mold layers 112 and 116 and/or the insulating interlayer 104. In example embodiments of the present invention, the first protection layer 110 may be formed of a metal oxide, a nitride and/or an anti-reflective coating material. For example, the first protection layer 110 may be formed of hafnium oxide, aluminum oxide, or silicon nitride. The first protection layer 110 may be formed by a chemical vapor deposition (CVD) process, an atomic layer deposition (ALD) process, or a sputtering process.

A surface of the first protection layer 110 may be treated to further reduce or prevent the permeation of the etching chemicals. The surface of the first protection layer 110 may be thermally treated or may be treated with plasma. That is, the first protection layer 110 may undergo a plasma treatment process or a thermal treatment process. In an example embodiment of the present invention, the surface of the first protection layer 110 may be treated at a temperature between about 360 to about 440° C. under an ammonia ($NH_3$) atmosphere or an oxygen ($O_2$) atmosphere. If the surface of the first protection layer 110 is treated at a temperature below about 360° C., the surface of the first protection layer 110 may not be sufficiently treated. If the surface of the first protection layer 110 is treated at a temperature of above about 440° C., the capacitor may not be precisely formed.

In an example embodiment of the present invention, the first protection layer 110 may be formed and thermally treated in-situ. In another example embodiment of the present invention, the surface treatment of the first protection layer 110 may be omitted to reduce process time and cost of forming the capacitor.

The first mold layer 112 may be formed on the first protection layer 110. The first mold layer 112 may be formed of an oxide for example silicon oxide. For example, the first mold layer 112 may be formed of TEOS, HDP-CVD oxide, PSG, BPSG, USG, and/or SOG. In an example embodiment of the present invention, the first mold layer 112 may have a multi-layer structure composed of an oxide. The thickness of the first mold layer 112 may be adjusted in accordance with a desired capacitance of the capacitor. In other words, to control the thickness of the first mold layer 112, a height of the capacitor may be adjusted because the height of the capacitor depends on the thickness of the first mold layer 112.

A supporting layer 114 may be formed on the first mold layer 112. The supporting layer 114 may be formed of a material having an etching selectivity with respect to the first mold layer 112 and the second mold layer 116. In particular, the supporting layer 114 may have an etch rate slower than those of the mold layers 112 and 116. For example, the supporting layer 114 may be etched at a rate about 200 times slower than that of the mold layers 112 and 116. That is, the supporting layer 114 may have an etching selectivity of about 200:1 relative to the mold layers 112 and 116. Thus, the supporting layer 114 may be formed using, for example, silicon nitride.

The second mold layer 116 may be formed on the supporting layer 114. The second mold layer 116 may be formed of a material substantially identical to that of the first mold layer 112. In an example embodiment of the present invention, the second mold layer 116 may be formed of an oxide for example silicon oxide. For example, the second mold layer 116 may be formed of TEOS, HDP-CVD oxide, PSG, USG, BPSG, and/or SOG.

The second mold layer 116, the supporting layer 114, the first mold layer 112, the first protection layer 110, and the etch stop layer 108 may be partially etched to thereby form an opening 118. The opening 118 may expose the pad 106 formed in the insulating interlayer 104. The opening 118 may be formed by over-etching to completely remove the etch stop layer 108 positioned on the pad 106. Hence, an upper portion of the pad 106 may be slightly etched to thereby form a recess at the upper portion of the pad 106. That is, the recess may be formed at an upper central portion of the pad 106 when the opening 118 is formed.

Figure 4:
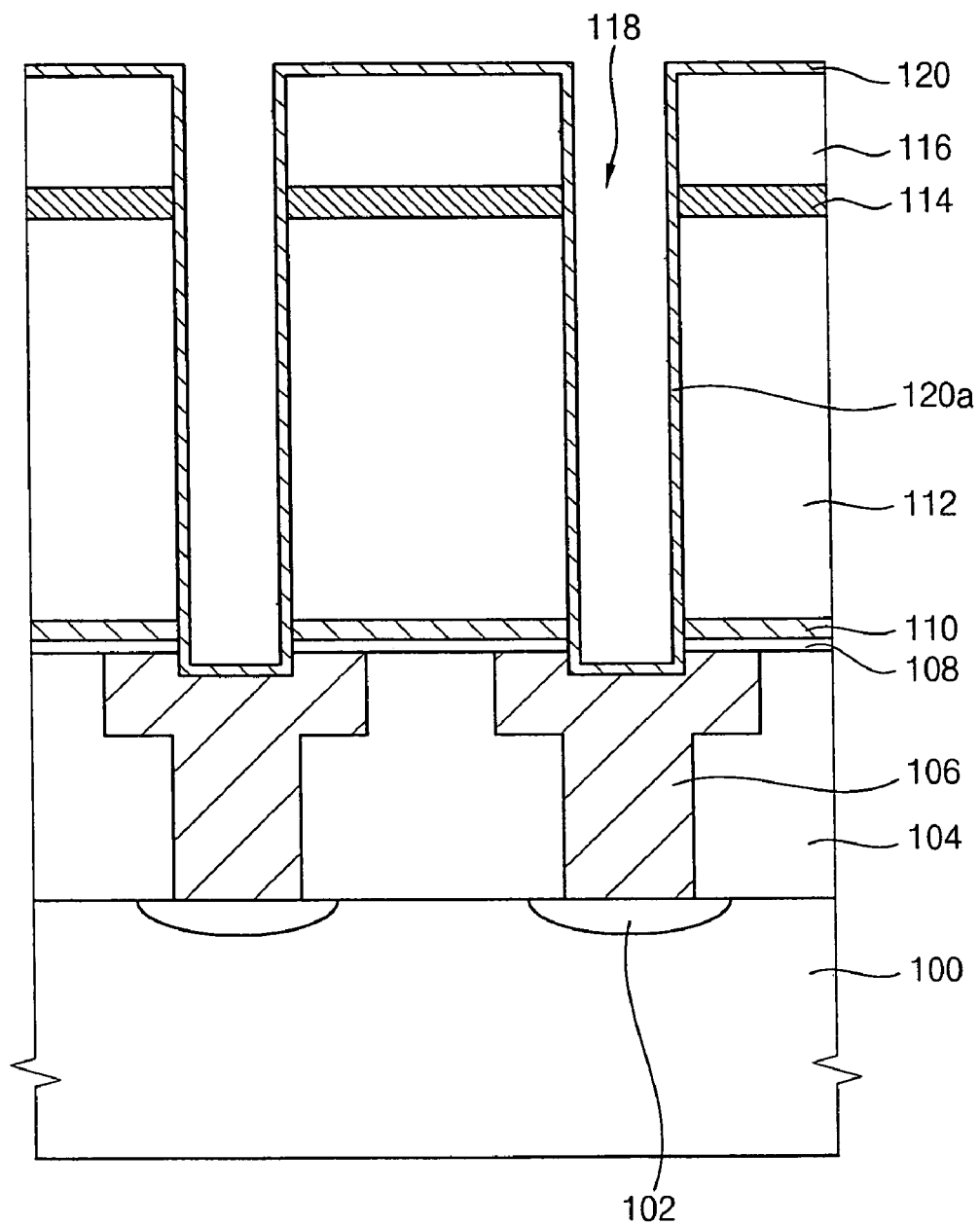

Referring to FIG. 4, a preliminary second protection layer 120 may be formed on the pad 106, a sidewall of the opening 118 and/or the second mold layer 116. The preliminary second protection layer 120 may be formed of a material having an etching selectivity with respect to an oxide. For example, the preliminary second protection layer 120 may be formed of silicon nitride, an anti-reflective coating material, a metal oxide for example hafnium oxide or aluminum oxide. The preliminary second protection layer 120 may have a thickness sufficient to protect the lower electrode 122a. The preliminary second protection layer 120 may be partially etched to form a second protection layer 120a.

The second protection layer 120a may protect the lower electrode 122a and may also serve as a supplemental dielectric layer for the capacitor. Thus, the second protection layer 120a may have a thickness to protect the lower electrode 122a and also to reduce or prevent an increase in the thickness of the capacitor; the capacitor may have a reduced capacitance when the second protection layer 120a thickness is too great. For example, the second protection layer 120a may have a thickness less than about 100 Å.

A surface of the preliminary second protection layer 120 may be treated with heat or plasma to protect the lower electrode 122a. In example embodiments of the present invention, the surface of the preliminary second protection layer 120 may be treated at a temperature of about 360 to about 440° C. under an ammonia atmosphere or an oxygen atmosphere. When the surface of the preliminary second protection layer 120 is treated at a temperature below about 360° C., the surface of the preliminary second protection layer 120 may not be sufficiently treated. When the surface of the preliminary second protection layer 120 is treated at a temperature above about 440° C., the capacitor may not be precisely formed. In an example embodiment of the present invention, the preliminary second protection layer 120 may be formed and thermally treated in-situ. In another example embodiment of the present invention, the surface treatment of the preliminary second protection layer 120 may be omitted to reduce process time and the cost for forming the capacitor.

Figure 5:
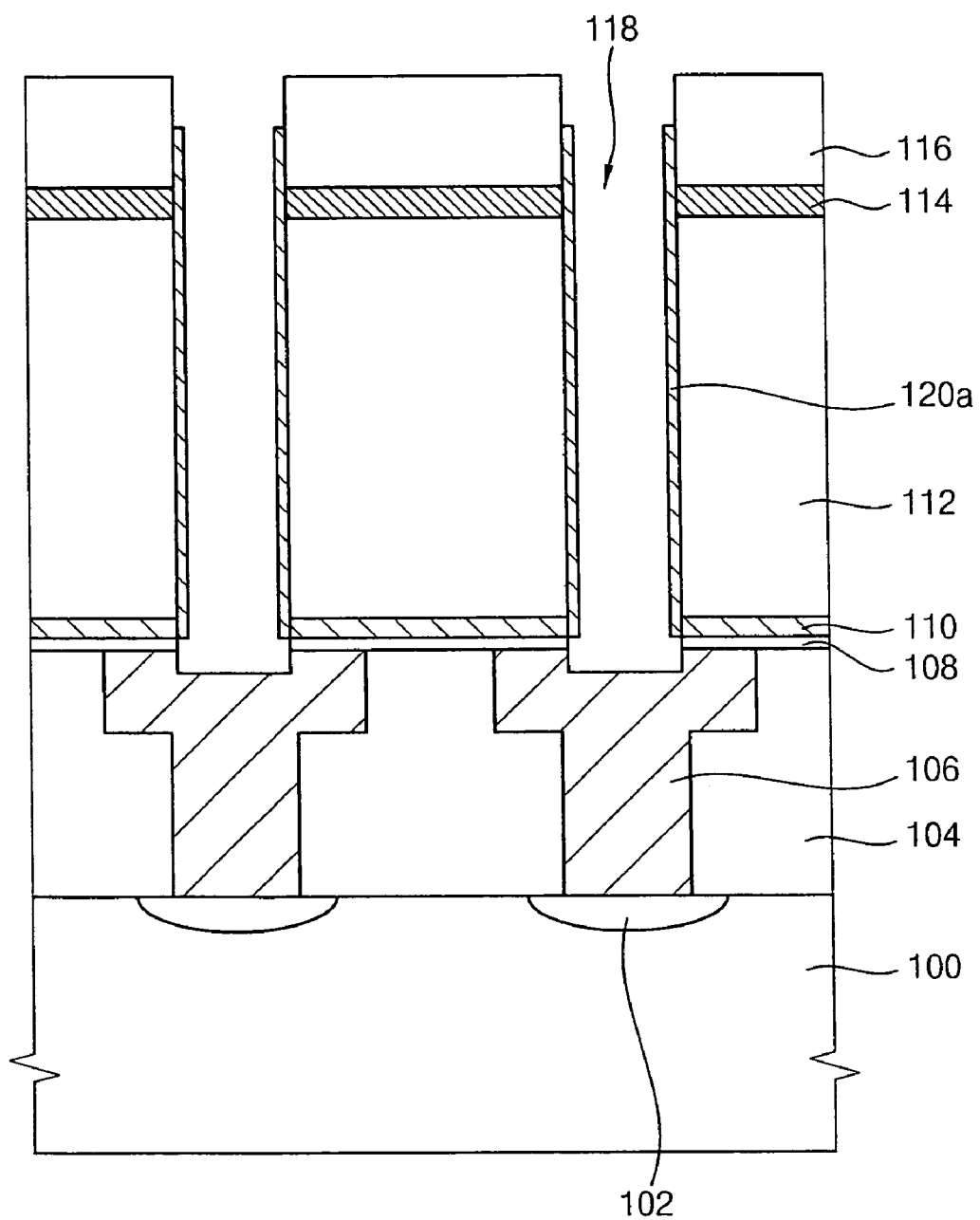

Referring to FIG. 5, the preliminary second protection layer 120 may be partially etched to thereby form the second protection layer 120a on the sidewall of the opening 118. That is, portions of the preliminary second protection layer 120 are removed from the second mold layer 116 and the pad 106 so that the second protection layer 120a may be formed on the sidewall of the opening 118. The second protection layer 120a may be formed by an anisotropic etching process. A lower end portion of the second protection layer 120a may be attached to the first protection layer 110.

When the second protection layer 120a is formed, the protection structure may be completed. The protection structure may include the first and the second protection layers 110 and 120a and may protect the lower electrode 122a, the pad 106 and/or other underlying layers for example the insulating interlayer 104 and the etch stop layer 108. The first protection layer 110 may be positioned on the etch stop layer 108 while the second protection layer 120a may be formed on the sidewall of the lower electrode 122a. Hence, the protection structure may have a cross-section of an "L" shape. After forming the protection structure, the pad 106 having the recess may be exposed through the opening 118.

Figure 6:
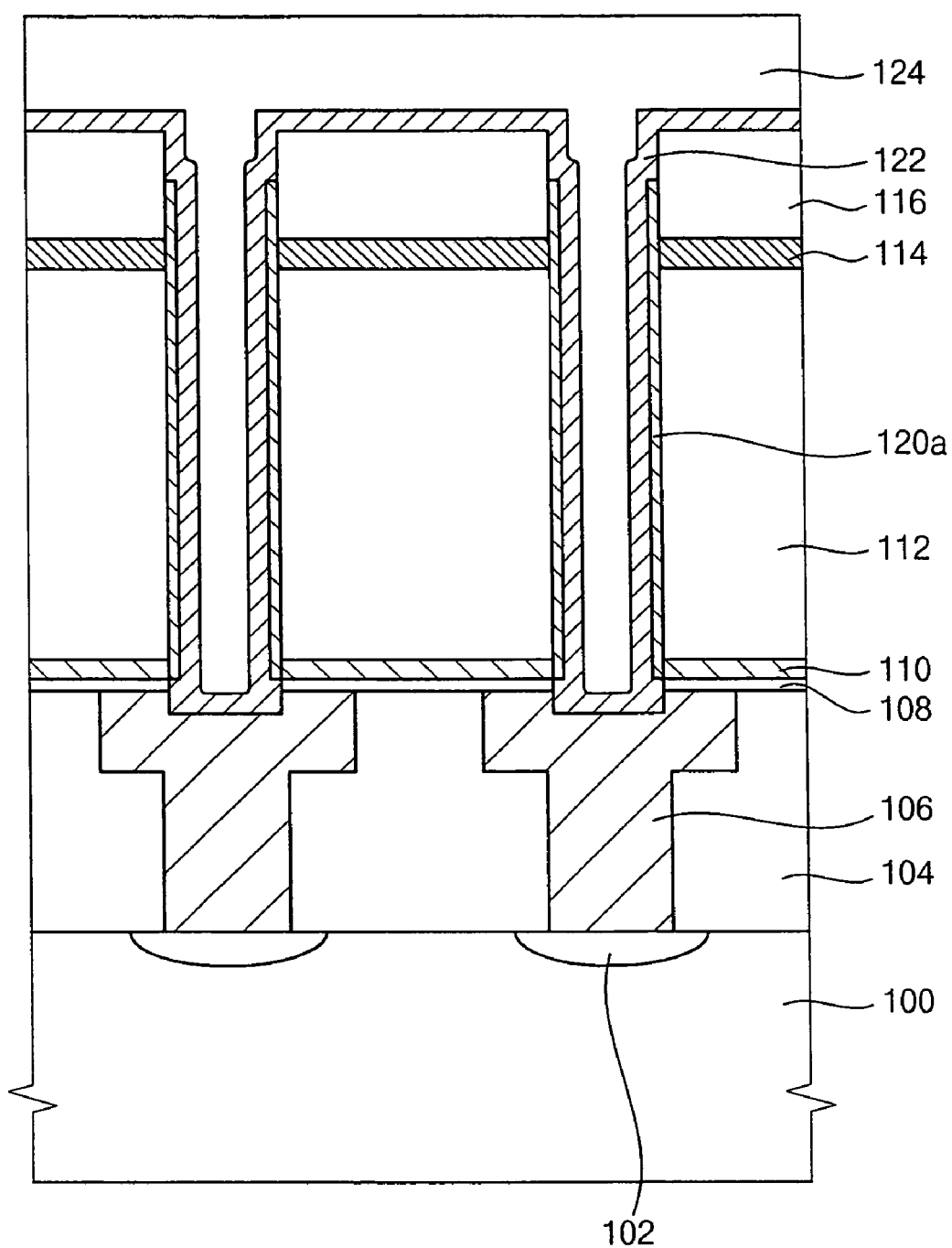

Referring to FIG. 6, a lower electrode layer 122 may be continuously formed on the exposed pad 106, the second protection layer 120a and on the sidewall of the opening 118. The lower electrode layer 122 may be formed of a metal material or a conductive metal nitride. For example, the lower electrode layer 122 may be formed of titanium, titanium nitride, tantalum, and/or tantalum nitride. The lower electrode layer 122 may be formed to have a multi-layer structure.

If the lower electrode layer 122 is formed of a metal material, the capacitor may have a capacitance substantially larger than that of a capacitor including a lower electrode of doped polysilicon. In an example embodiment of the present invention, the protection structure may be formed of titanium and the lower electrode layer 122 may be formed of titanium nitride.

Because the opening 118 may have a relatively high aspect ratio, the lower electrode layer 122 should have good step coverage. Thus, the lower electrode layer 122 may be formed by a CVD process or an ALD process.

When the protection structure is formed of titanium and the lower electrode layer 122 is formed of titanium nitride, first source gases employed by the CVD process may include $TiCl_4$ and $NH_3$. In addition, the protection structure and the lower electrode layer 122 may be formed at a temperature range about 360 to about 440° C. The protection structure and the lower electrode layer 122 may have columnar structures, respectively.

Alternatively, second source gases used to form the protection structure and the lower electrode layer 122 may include tetrakis-dimethyl-amino-titanium (TDMAT). When the second source gases contain TDMAT, the protection structure and the lower electrode layer 122 may have cross-linked molecular structures.

The protection structure and the lower electrode layer 122 formed using the first source gases may have resistance substantially lower than those of the protection structure and the lower electrode layer 122 formed using the second source gases. However, the chemicals employed in the etching processes may permeate into grain boundaries of the protection structure and the lower electrode layer 122 when formed using the first source gases because the protection structure and the lower electrode layer 122 made from the first source gases have the columnar structures. When the pad 106 and the lower electrode 122a are formed from different materials from each other, the pad 106 may be easily etched by the permeated chemicals because of galvanic coupling between the pad 106 and the lower electrode 122a. Particularly, the pad 106 including doped polysilicon may be rapidly etched by the permeated chemicals, thereby frequently causing a failure of the capacitor. However, this failure of the capacitor may be reduced when the protection structure and the lower electrode layer 122 are formed using the second source gases.

Referring to FIG. 6, a sacrificial layer 124 is formed on the lower electrode layer 122 to fill up the opening 118. The sacrificial layer 124 may be formed oxide. For example, the sacrificial layer 124 may be formed of PSG, USG, BPSG, and/or SOG.

Figure 7:
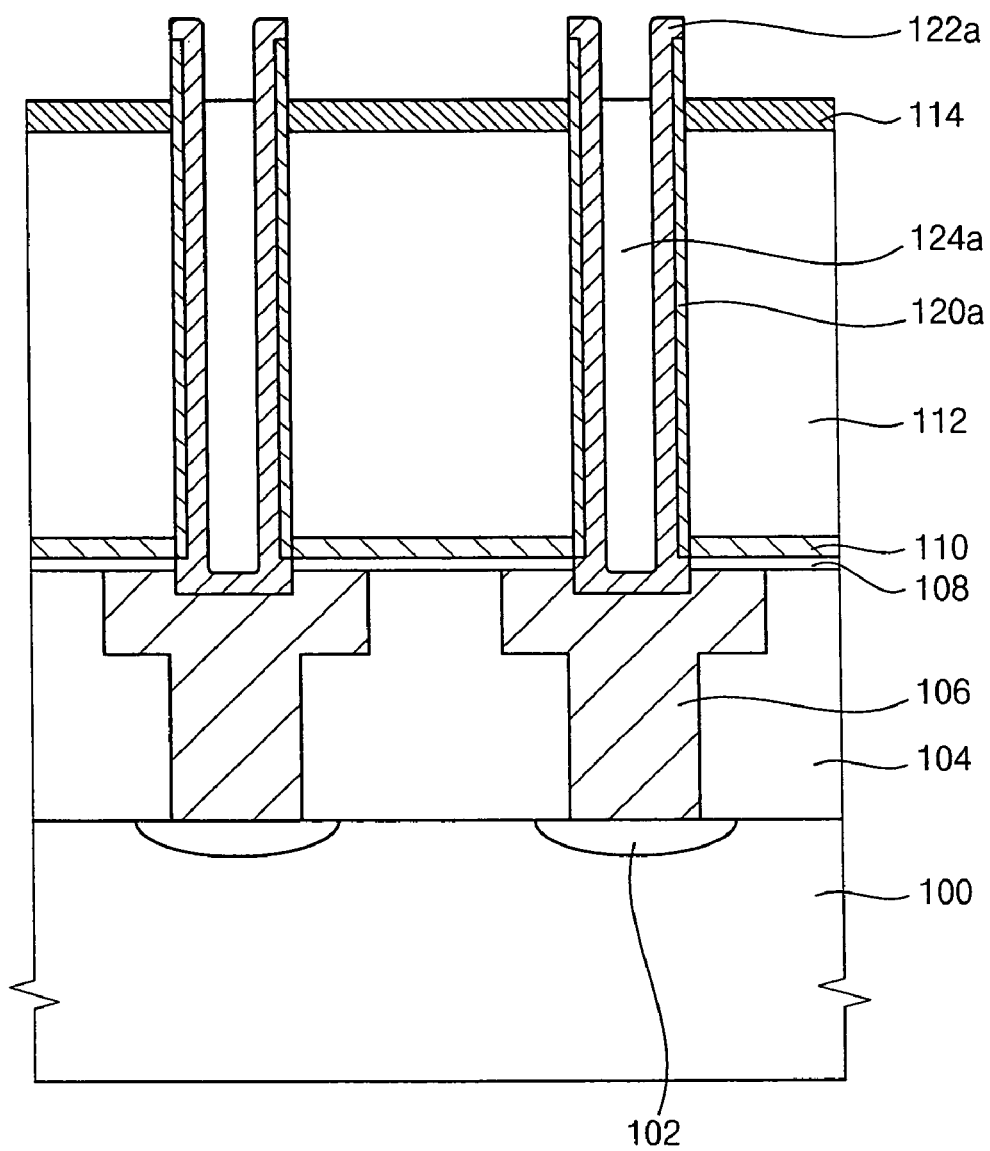

Referring to FIG. 7, the sacrificial layer 124 may be partially removed by a chemical mechanical polishing (CMP) process until the lower electrode layer 122 is partially exposed. The exposed portion of the lower electrode layer 122 may be removed to form the lower electrode 122a in the opening 118. The lower electrode 122a may be also formed by an etch back process.

The second mold layer 116 and portions of the sacrificial layer 124 may be removed until the supporting layer 114 is exposed. Thereby, upper portions of the lower electrode 122a and the second protection layer 120a may be exposed. In addition, a sacrificial layer pattern 124a may be formed in the cylindrical lower electrode 122a.

Figure 8:
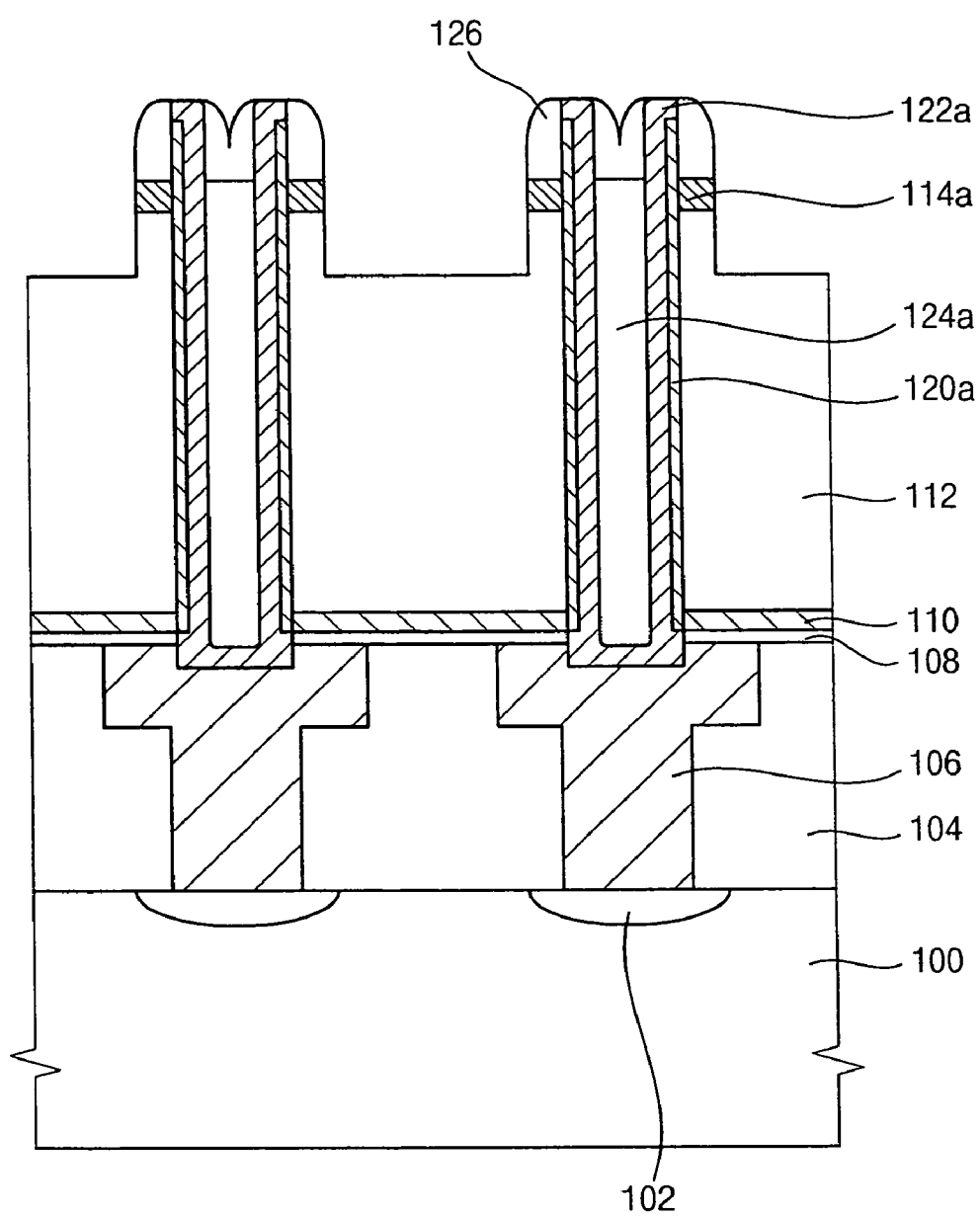

Referring to FIG. 8, an insulation layer may be formed on the supporting layer 114, and the exposed lower electrode 122a and the second protection layer 120a. The insulation layer may be formed of a material that has an etching selectivity substantially identical to that of the sacrificial layer pattern 124a and the first mold layer 112. The insulation layer may be formed of an oxide for example silicon oxide.

The insulation layer may be anisotropically etched to form a spacer 126 on sidewall of the lower electrode 122a and the second protection layer 120a. After forming the spacer 126, a portion of the supporting layer 114 between adjacent lower electrodes 122a may be exposed along a perpendicular direction relative to the contact regions 102. However, another portion of the supporting layer 114 between the adjacent lower electrodes 122a need not be exposed along the diagonal direction because of the formation of the spacer 126.

The exposed portion of the supporting layer 114 and an upper portion of the first mold layer 112 may be etched using the spacer 126 as an etching mask to form a supporting member 114a disposed on an upper portion of the second protection layer 120a. The supporting member 114a may be positioned around the upper portion of the lower electrode 122a. The supporting member 114a may have a ring shape. In an example embodiment of the present invention, adjacent supporting members 114a in a unit cell of a semiconductor device may have a mesh structure. Because the adjacent supporting members 114a may be connected to one another, the capacitor having the supporting member 114a may have improved structural stability and/or also reduce the possibility of the capacitor from falling over.

Figure 9:
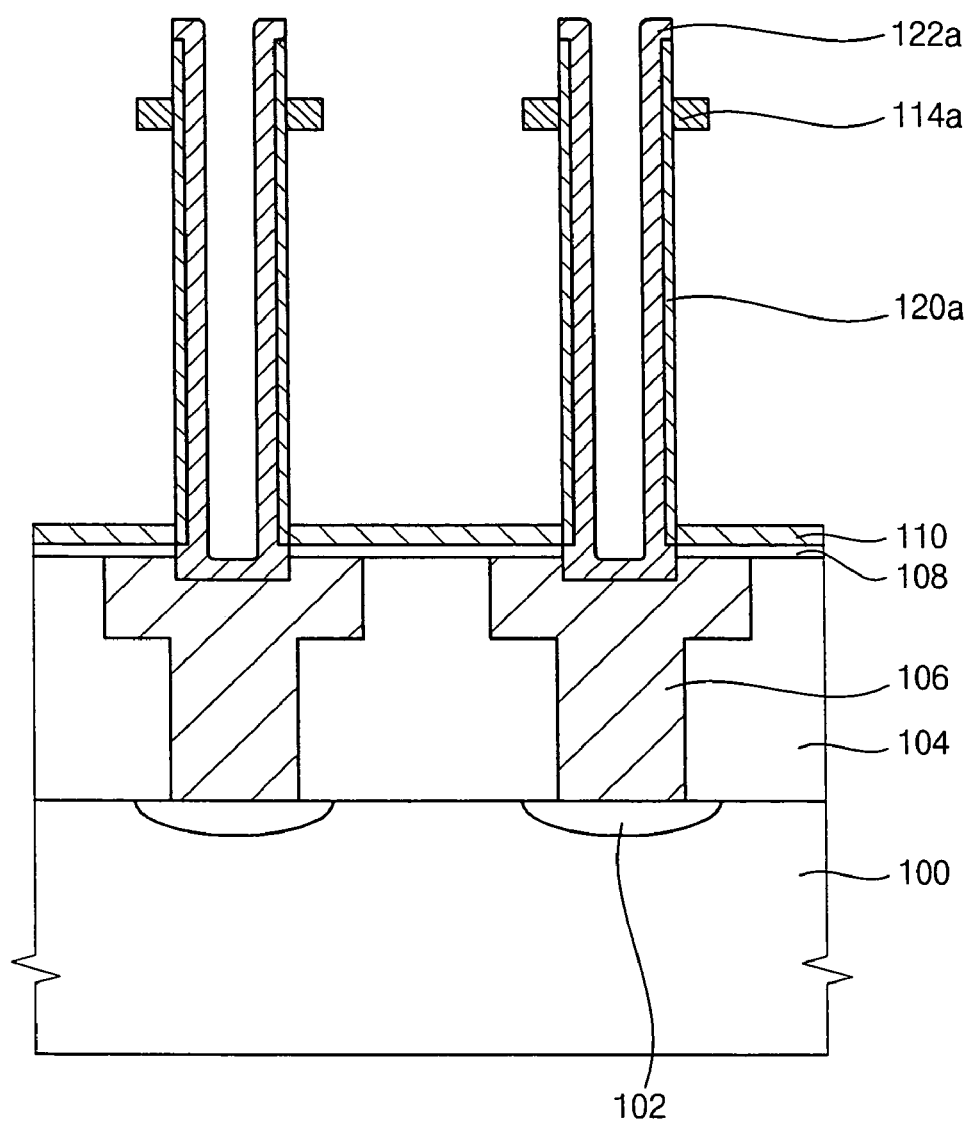

Referring to FIG. 9, the sacrificial layer pattern 124a, the first mold layer 112 and the spacer 126 may be removed to thereby complete the lower electrode 122a, the supporting member 114a and the protection structure. The sacrificial layer pattern 124a, the first mold layer 112 and the spacer may be etched by a wet etching process using an etching solution. The etching solution may contain hydrogen fluoride (HF). Alternatively, the etching solution may include ammonium hydroxide ($NH_4OH$), hydrogen peroxide ($H_2O_2$) and deionized water for example a standard cleaning 1 (SC1) solution. Further, the etching solution may include ammonium fluoride ($NH_4F$), hydrogen fluoride and deionized water for example an LAL solution.

Because the protection structure is formed on the lower electrode 122a and the etch stop layer 108, the etching solution containing various chemicals may be reduced or prevented from permeating into the pad 106, the insulating interlayer 104 and/or the lower electrode 122a. Thus, the capacitor including the protection structure may have enhanced electrical characteristics without causing damage to the pad 106, the lower electrode 122a and/or the insulating interlayer 104.

As illustrated in FIG. 2, a dielectric layer 128 may be formed on the lower electrode 122a, the supporting member 114a and the protection structure. The dielectric layer 128 may be formed of a metal oxide that has a high dielectric constant. For example, the dielectric layer 128 may be formed of hafnium oxide, titanium oxide, or aluminum oxide. In addition, the dielectric layer 128 may be formed by a CVD process or an ALD process. The dielectric layer 128 may be formed at a temperature of about 360 to about 440° C. If the dielectric layer 128 including the metal oxide is formed at a temperature above about 440° C., a leakage current from the capacitor may greatly increase.

An upper electrode 130 may be formed on the dielectric layer 128. The upper electrode 130 may be formed of a metal or polysilicon doped with impurities. The upper electrode 130 may sufficiently cover the underlying structures. In an example embodiment of the present invention, the upper electrode 130 may be formed of a material substantially identical to that of the lower electrode 122a.

Figure 10:
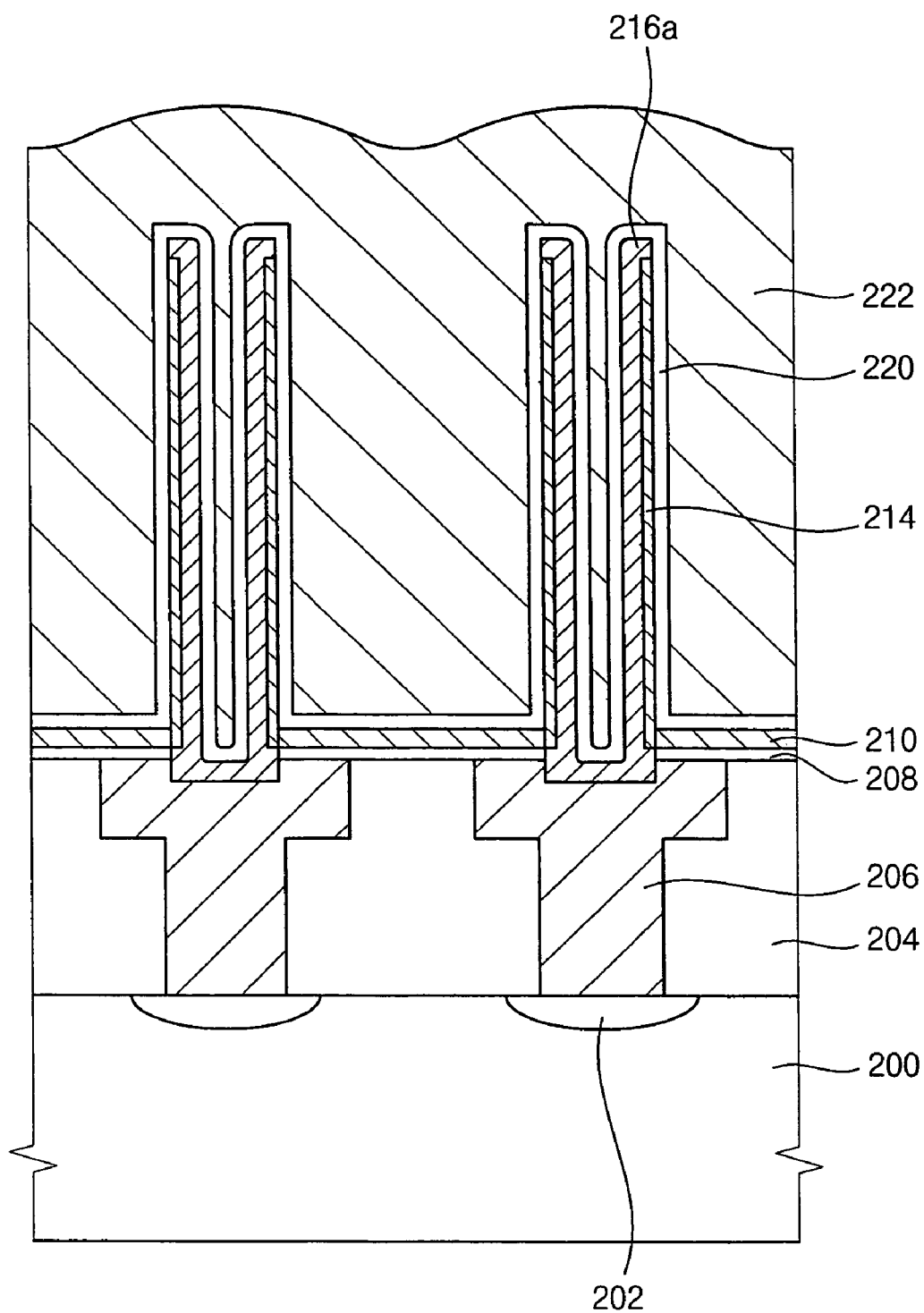
FIG. 10 is a cross-sectional view illustrating a capacitor in accordance with another example embodiment of the present invention.

FIG. 10 is a cross-sectional view illustrating a capacitor according to another example embodiment of the present invention.

As shown in FIG. 10, the capacitor may have a construction substantially similar to that of the capacitor described with reference to FIG. 2, except for the supporting member 114a. Thus, detailed descriptions of similar elements will be omitted.

Referring to FIG. 10, the capacitor may include a substrate 200 having a contact region 202, an insulating interlayer 204 formed on the substrate 200, a pad 206 formed through the insulating interlayer 204, an etch stop layer 208 formed on the pad 206 and the insulating interlayer 204, a lower electrode 216a contacting with the pad 206, a protection structure formed on the etch stop layer 208 and an outer sidewall of the lower electrode 216a, a dielectric layer 220 formed on the protection structure and the lower electrode 216a, and an upper electrode 222 formed on the dielectric layer 220.

As described above, the protection structure may include a first protection layer 210 formed on the etch stop layer 208, and a second protection layer 214 formed on the outer sidewall of the lower electrode 216a.

FIGS. 11 to 14 are cross-sectional views illustrating a method of manufacturing the capacitor according to an example embodiment shown in FIG. 10.

Figure 11:
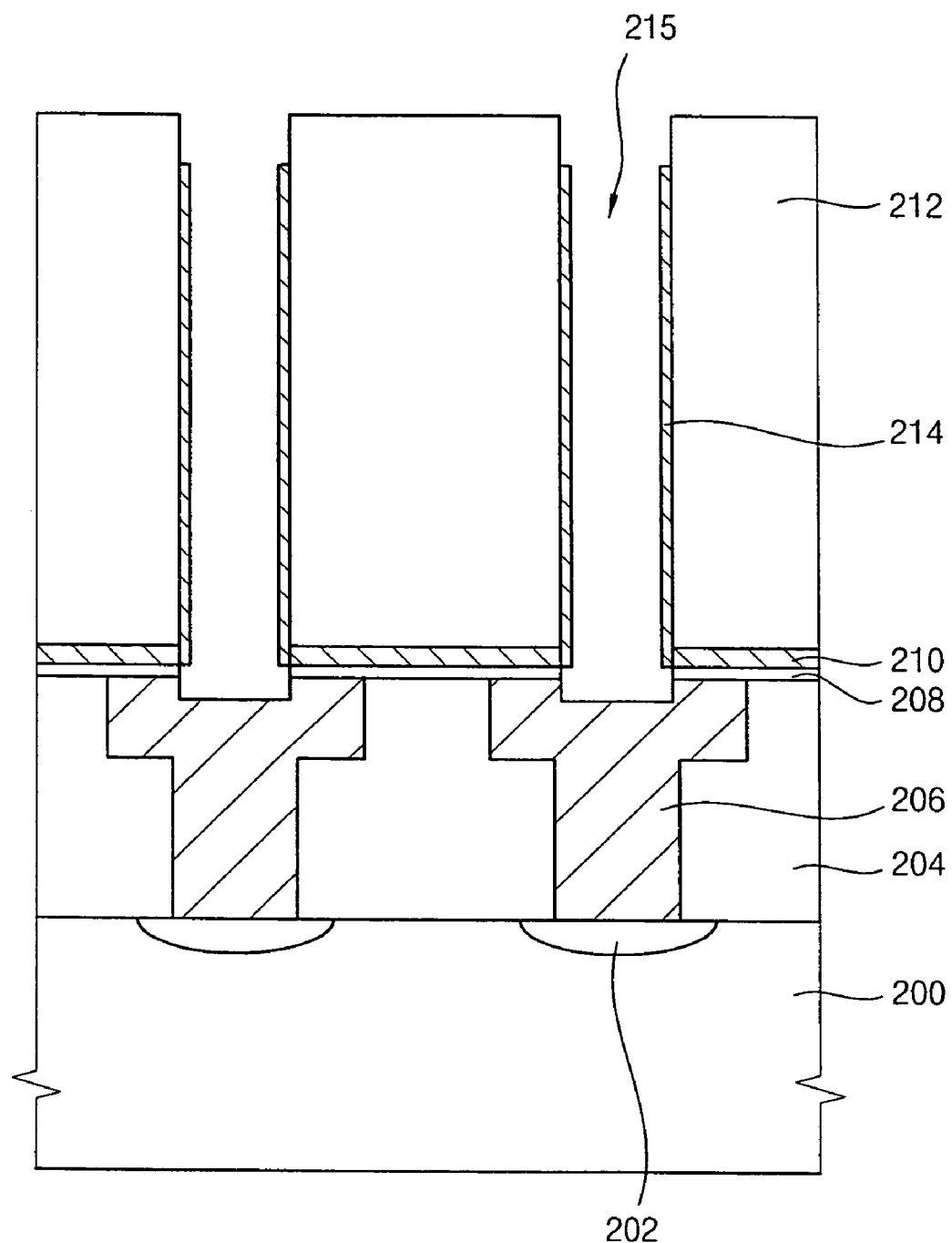
FIGS. 11 to 14 are cross-sectional views illustrating a method of manufacturing a capacitor in accordance with another example embodiment of the present invention.

Referring to FIG. 11, an isolation layer (not shown) may be formed on a semiconductor substrate 200 by an isolation process, for example, a trench isolation process, thereby defining an active region of the substrate 200.

A transistor (not shown) having a gate structure and source/drain regions may be formed on the active region of the substrate 200. The gate structure may include a gate insulation layer, a gate electrode, a gate mask and/or a gate spacer. One of the source/drain regions may correspond to a contact region 202.

After an insulating interlayer 204 is formed on the substrate 200 to cover the transistor, a contact hole (not shown) that exposes the contact region 202 may be formed through the insulating interlayer 204 by partially etching the insulating interlayer 204. An upper portion of the contact hole may be substantially wider than a lower portion of the contact hole.

After a conductive layer is formed on the insulating interlayer 204 to fill up the contact hole, the conductive layer may be partially removed until the insulating interlayer 204 is exposed, thereby forming a pad 206 in the contact hole. The pad 206 may be formed of polysilicon doped with impurities, or a metal material having a high melting point for example, tungsten or titanium.

An etch stop layer 208 may be formed on the insulating interlayer 204 and the pad 206. The etch stop layer 208 may be formed using a material that has an etching selectivity relative to the insulating interlayer 204 and a mold layer 212. For example, the etch stop layer 208 is formed of silicon nitride.

A first protection layer 210 may be formed on the etch stop layer 208. The first protection layer 210 may reduced or prevent chemicals used in proceeding etching processes from permeating into the pad 206 and the insulating interlayer 204. The first protection layer 210 may be formed of a material having an etching selectivity relative to the mold layer 212 and the insulating interlayer 204. The first protection layer 210 may be of a metal oxide, a nitride or an anti-reflective material. For example, the first protection layer 210 may be formed of hafnium oxide, aluminum oxide, or silicon nitride.

A surface of the first protection layer 210 may be treated so that the first protection layer 210 may reduce or prevent permeation of etching chemicals. The surface of the first protection layer 210 may be thermally treated or may be plasma treated. The surface of the first protection layer 210 may be treated under an ammonia atmosphere or an oxygen atmosphere.

The mold layer 212 may be formed on the first protection layer 210. The mold layer 212 may be formed of an oxide for example silicon oxide. For example, the mold layer 212 may be formed of TEOS, HDP-CVD oxide, PSG, BPSG, USG, and/or SOG. In an example embodiment of the present invention, the mold layer 112 may have a multi-layer structure composed of oxides.

The mold layer 212, the first protection layer 210 and the etch stop layer 208 may be partially etched to thereby form an opening 215 exposing the pad 206. When the opening 215 is formed through the mold layer 212, the first protection layer 210 and the etch stop layer 208, these layers 212, 210 and 208 may be over-etched so as to completely remove the etch stop layer 208 positioned on the pad 206. Thus, an upper portion of the pad 206 may be slightly etched to thereby form a recess at the upper portion of the pad 206.

A preliminary second protection layer may be formed on the pad 206, a sidewall of the opening 215 and the mold layer 212. The preliminary second protection layer may be formed of a material having an etching selectivity with respect to an oxide. For example, the preliminary second protection layer may be formed of silicon nitride, an anti-reflective coating material or a metal oxide for example hafnium oxide or aluminum oxide. A surface of the preliminary second protection layer 120 may be heat or plasma treated. The preliminary second protection layer may be partially etched to form a second protection layer 214 on the sidewall of the opening 215. The preliminary second protection layer may be etched by an anisotropic etching process.

When the second protection layer 214 is formed, a protection structure having the first and the second protection layers 210 and 214 is completed. The second protection layer 214 may be integrally formed with the first protection layer 210. The second protection layer 214 may protect a lower electrode 216a and also may serve as a supplemental dielectric layer for the capacitor.

Figure 12:
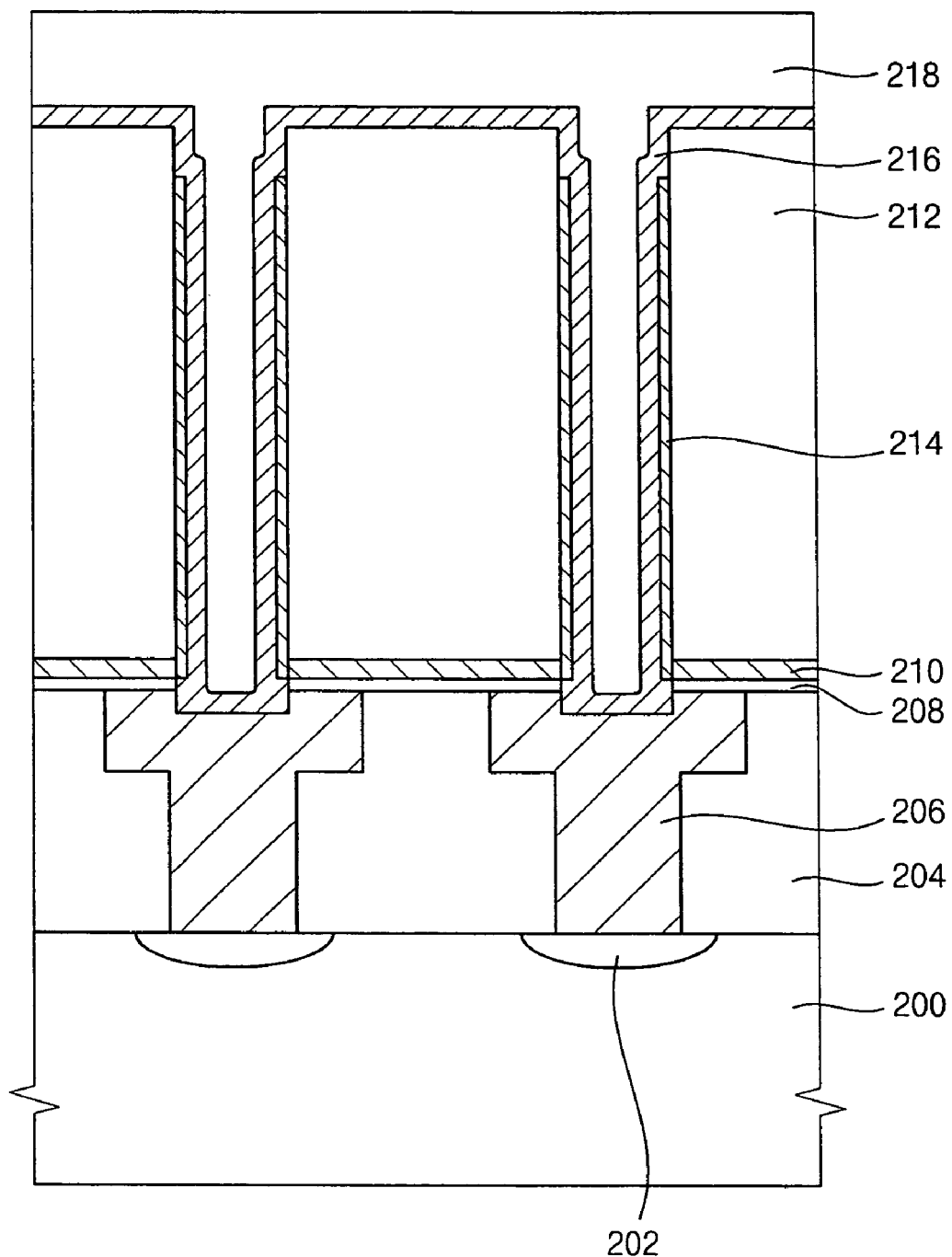

Referring to FIG. 12, a lower electrode layer 216 may be continuously formed on the pad 206, the second protection layer 214 and on the sidewall of the opening 215. The lower electrode layer 216 may be formed of a metal material or a conductive metal nitride. For example, the lower electrode layer 216 may be formed of titanium, titanium nitride, tantalum, or tantalum nitride. Alternatively, the lower electrode layer 216 may have a multi-layer structure.

Because the opening 215 may have a relatively high aspect ratio, the lower electrode layer 216 has good step coverage. Hence, the lower electrode layer 216 may be formed by a CVD process or an ALD process.

A sacrificial layer 218 may be formed on the lower electrode layer 216 to fill up the opening 215. The sacrificial layer 218 may be formed using an oxide for example, PSG, USG, BPSG, or SOG.

Figure 13:
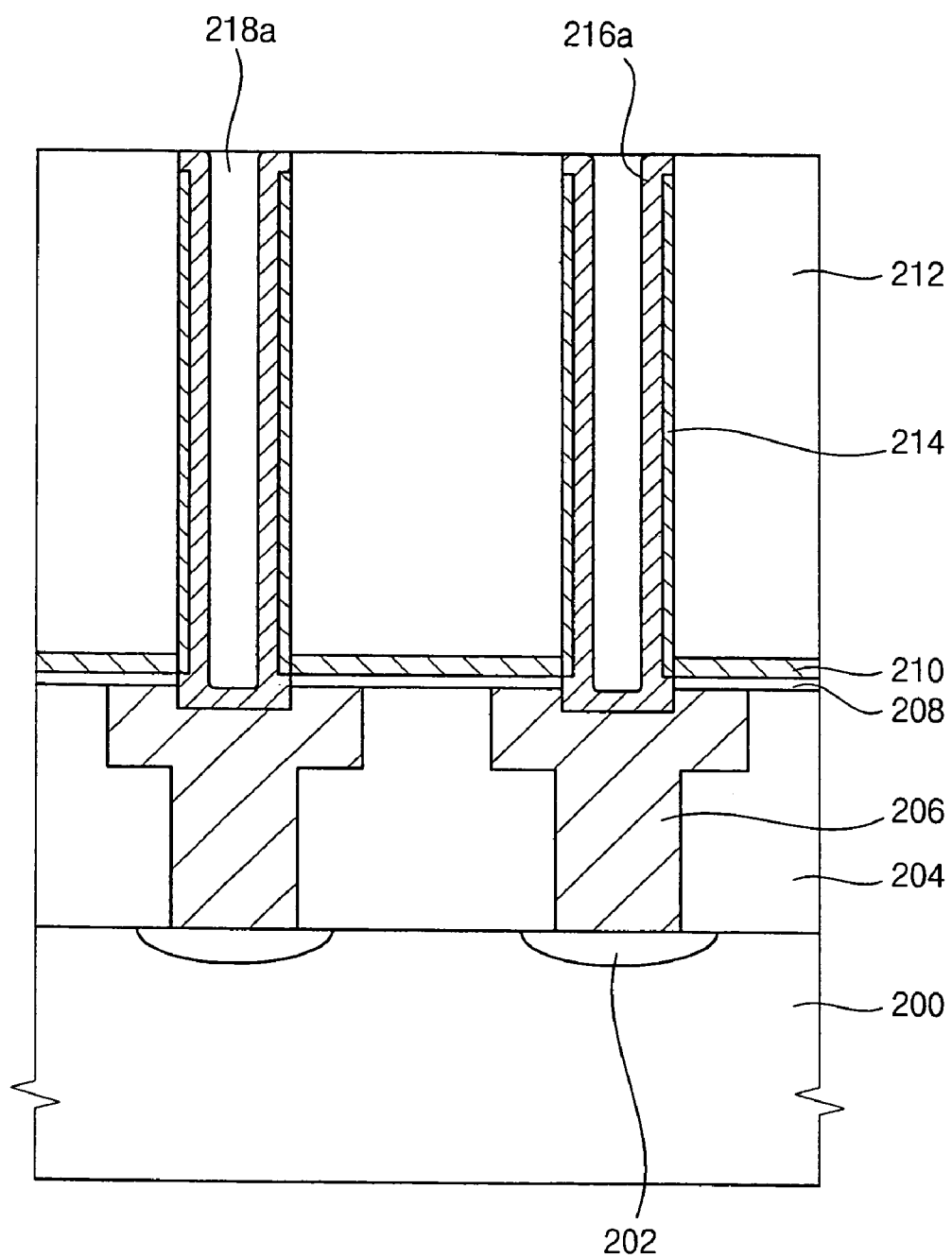

Referring to FIG. 13, the sacrificial layer 218 may be partially removed by a CMP process until the lower electrode layer 216 is exposed. The exposed lower electrode layer 216 and an upper portion of the sacrificial layer 218 are partially removed to form the lower electrode 216a and a sacrificial layer pattern 218a in the opening 215. The lower electrode 216a and the sacrificial layer pattern 218a may be formed by a CMP process or an etch back process.

Figure 14:
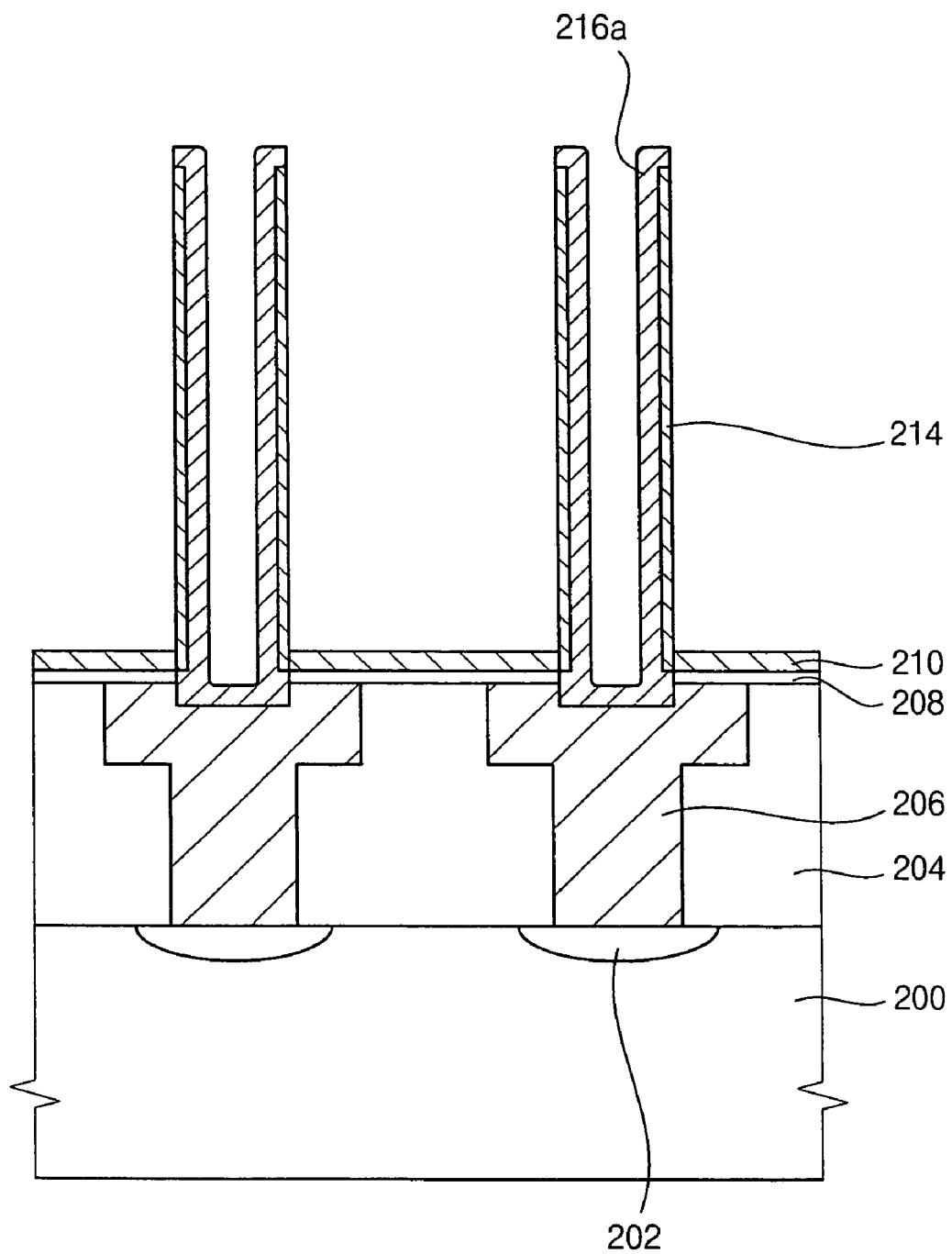

Referring to FIG. 14, the sacrificial layer pattern 218a and the mold layer 212 may be removed to complete the lower electrode 216a and the protection structure. The sacrificial layer pattern 218a and the mold layer 212 may be etched by a wet etching process using an etching solution. Because the protection structure may be formed on the lower electrode 216a and the etch stop layer 208, the etching solution containing chemicals may not permeate into the pad 206, the insulating interlayer 204 and the lower electrode 216a. Thus, the capacitor including the protection structure may have enhanced electrical characteristics, in addition to reducing or preventing damage to the pad 206, the lower electrode 216a and the insulating interlayer 204.

Referring to FIG. 10, the dielectric layer 220 may be formed on the lower electrode 216a and the protection structure. The dielectric layer 220 may be formed of a metal oxide that has a high dielectric constant for example, hafnium oxide, titanium oxide, or aluminum oxide.

The upper electrode 222 may be formed on the dielectric layer 220. The upper electrode 222 may be formed of a metal or polysilicon doped with impurities. The upper electrode 222 may be formed using a material substantially identical to that of the lower electrode 216a.

According to example embodiments of the present invention, chemicals used in manufacturing processes for a capacitor may be prevented from permeating into a lower electrode, a pad and/or other underlying layers of the capacitor because the capacitor includes a protection structure. As a result, the capacitor including the protection structure may have improved electrical characteristics. Additionally, the capacitor may include a supporting member connected to an adjacent supporting member of an adjacent capacitor so that the capacitor may have an enhanced structural stability while reducing the possibility of falling over.

The foregoing description is illustrative of example embodiments of the present invention and is not to be construed as limiting thereof. Although a few example embodiments of the present invention have been described, those skilled in the art will readily appreciate that many modifications are possible in example embodiments without materially departing from the novel teachings and advantages of this invention. Accordingly, all such modifications are intended to be included within the scope of the present invention. Therefore, it is to be understood that the foregoing is illustrative of the present invention and is not to be construed as limited to the specific embodiments disclosed, and that modifications to the disclosed embodiments, as well as other embodiments, are intended to be included within the scope of example embodiments of the present invention.

What is claimed is:

1. A capacitor comprising:
    an insulating interlayer including a conductive pattern formed on a substrate;
    a lower electrode electrically connected to the conductive pattern;
    a protection structure formed on an outer sidewall of the lower electrode and on the insulating interlayer;
    a dielectric layer formed on the lower electrode and the protection structure; and
    an upper electrode formed on the dielectric layer,
    wherein the conductive pattern has a recess in an upper portion thereof and the lower electrode is connected to the conductive pattern at the recess, the recess defined only by the conductive pattern.

2. The capacitor of claim 1, wherein the conductive pattern comprises polysilicon doped with impurities.

3. The capacitor of claim 1, wherein the lower electrode includes metal or a metal compound.

4. The capacitor of claim 3, wherein the lower electrode has a multi-layer structure that includes at least one of titanium (Ti) and titanium nitride (TiN).

5. The capacitor of claim 1, wherein the protection structure includes a first protection layer formed on the insulating interlayer and a second protection layer formed on the outer sidewall of the lower electrode.

6. The capacitor of claim 5, wherein the second protection layer is buried between the lower electrode and the dielectric layer.

7. The capacitor of claim 5, wherein a material of the second protection layer is different than the first protection layer.

8. The capacitor of claim 5, wherein a material of the second protection layer is the same as the first protection layer.

9. The capacitor of claim 5, wherein the second protection layer is connected and integral with the first protection layer.

10. The capacitor of claim 5, wherein the second protection layer encloses the lower electrode.

11. The capacitor of claim 5, wherein the protection structure includes insulation material having an etching selectivity relative to the dielectric layer.

12. The capacitor of claim 11, wherein the protection structure includes at least one of metal oxide, silicon nitride and anti-reflective coating material.

13. The capacitor of claim 1, wherein a shape of the lower electrode is cylindrical.

14. The capacitor of claim 1, wherein a surface of the protection structure is thermally treated or treated using a plasma.

15. The capacitor of claim 1, further comprising an etch stop layer formed on the insulating interlayer.

16. The capacitor of claim 15, wherein the etch stop layer partially covers an upper surface of the conductive pattern.

17. The capacitor of claim 1, further comprising a supporting member enclosing the protection structure around an upper portion of the lower electrode, wherein the supporting member is connected to an adjacent supporting member of an adjacent capacitor.

18. The capacitor of claim 1, wherein the lower electrode makes direct contact with the conductive pattern.

* * * * *